(12) United States Patent
Takahashi

(10) Patent No.: US 8,407,522 B2
(45) Date of Patent: Mar. 26, 2013

(54) TEST APPARATUS AND RECORDING MEDIUM

(75) Inventor: Koji Takahashi, Saitama (JP)

(73) Assignee: Advantest Corporation, Tokyo (JP)

(*) Notice: Subject to any disclaimer, the term of this patent is extended or adjusted under 35 U.S.C. 154(b) by 807 days.

(21) Appl. No.: 12/487,644

(22) Filed: Jun. 18, 2009

(65) Prior Publication Data

US 2010/0169714 A1 Jul. 1, 2010

Related U.S. Application Data

(63) Continuation of application No. PCT/JP2008/061978, filed on Jul. 2, 2008.

(51) Int. Cl.
*G06F 11/00* (2006.01)
(52) U.S. Cl. .................. 714/30; 714/25; 714/37
(58) Field of Classification Search .............. 714/37, 714/25, 30
See application file for complete search history.

(56) References Cited

U.S. PATENT DOCUMENTS

| | | | | |
|---|---|---|---|---|
| 6,134,674 | A * | 10/2000 | Akasheh | 714/33 |
| 6,961,871 | B2 * | 11/2005 | Danialy et al. | 714/30 |
| 7,158,908 | B2 | 1/2007 | Iwamoto | |
| 2006/0224926 | A1 | 10/2006 | Iwamoto | |

FOREIGN PATENT DOCUMENTS

| | | |
|---|---|---|
| CN | 1573344 | 2/2005 |
| JP | 04-181321 A | 6/1992 |
| JP | 2004-163194 A | 6/2004 |
| JP | 2006-275986 A | 10/2006 |
| JP | 2006-317256 A | 11/2006 |

OTHER PUBLICATIONS

English translation of International Search Report (ISR) issued in PCT/JP2008/061978 (parent application) mailed in Sep. 2008 for Examiner consideration, citing U.S. Patent No. 7158908 and U.S. Patent Application Publication No. 2006/0224926 and Foreign Patent document Nos. JP2004-163194, JP2006-317256, JP2006-275986, and JP04-181321, which have been submitted with Japanese ISR in a previous IDS.
English translation of Written Opinion (PCT/ISA/237) issued in PCT/JP2008/061978 (parent application) mailed in Feb. 2011. Japanese Written Opinion has been submitted in a previous IDS.
ISA220, International Search Report (ISR), and ISA237 for PCT/JP2008/061978 (the parent application), citing US Patent No. 1, US Patent Application Publications Nos. 1, and Foreign Patent Documents Nos. 1-4 indicated above.
CN Office Action and English Translation Dated Aug. 31, 2012; Application No. 200880130090.9.

* cited by examiner

*Primary Examiner* — Scott Baderman
*Assistant Examiner* — Sarai Butler

(57) ABSTRACT

Provided is a test apparatus that tests a device under test, comprising a plurality of test modules that test the device under test; and a control section that controls the plurality of test modules. Each test module includes a test section that tests the device under test; and a self-diagnostic section that diagnoses operation of the test section based on diagnostic data supplied thereto. The control section supplies the diagnostic data in parallel to self-diagnostic sections for which the same type of diagnostic data is set, and supplies the diagnostic data sequentially to self-diagnostic sections for which a different type of diagnostic data is set.

19 Claims, 7 Drawing Sheets

TEST APPARATUS AND RECORDING MEDIUM

CROSS REFERENCE TO RELATED APPLICATION

This is a continuation application of PCT/JP2008/061978 filed on Jul. 2, 2008, the contents of which are incorporated herein by reference.

BACKGROUND

1. Technical Field

The present invention relates to a test apparatus and a recording medium.

2. Related Art

A known conventional test apparatus uses a plurality of test modules to test a device under test such as a semiconductor circuit, as in, for example, Japanese Patent Application Publication No. 2006-317256. These test modules are exchangeable in an input/output interface. The test apparatus includes a plurality of slots for holding test modules that can be exchanged with other test modules. With this configuration, the test apparatus tests the device under test using a variety of test modules.

The test apparatus has a diagnostic function to determine whether the test modules are operating correctly. For example, the test apparatus may perform a test in which the output signal of each test module is measured after being looped back and input to the test module that output the signal, or a test in which this looped back signal is input to a different test module.

In the test apparatus that holds each test module to be exchangeable, the test module inserted into each slot is not constant. Each type of test module may perform a different diagnostic process. Therefore, the test apparatus references a configuration file indicating the type of test module inserted into each slot, and performs diagnostic processes corresponding respectively to the types of test modules.

FIG. 7 shows an exemplary diagnostic operation performed by a plurality of test modules. The test apparatus of FIG. 7 diagnoses test modules A to F. The CPU of the test apparatus determines the type of diagnosis to be performed for each test module based on the configuration file. The CPU sets diagnostic data corresponding to the determined diagnostic content in the test module A (process 102).

After setting the diagnostic data for the test module A, the CPU of the test apparatus supplies the test module A with a command too perform a self-diagnosis (process 104). After the test module A performs the self-diagnosis, the CPU of the test apparatus analyzes the self-diagnosis result (process 106). By performing the processes 102 to 106 sequentially for each of the test modules, the CPU causes all of the test modules to perform the self-diagnosis.

In the above self-diagnosis processes, however, the test modules perform the self-diagnoses in sequence, and so a long time is needed for all of the test modules to finish the self diagnosis processes. This is particularly problematic when a large number of test modules are provided to the test apparatus.

SUMMARY

Therefore, it is an object of an aspect of the innovations herein to provide a test apparatus and a recording medium, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a plurality of test modules that test the device under test; and a control section that controls the plurality of test modules. Each test module includes a test section that tests the device under test; and a self-diagnostic section that diagnoses operation of the test section based on diagnostic data supplied thereto. The control section supplies the diagnostic data in parallel to self-diagnostic sections for which the same type of diagnostic data is set, and supplies the diagnostic data sequentially to self-diagnostic sections for which a different type of diagnostic data is set.

According to a second aspect related to the innovations herein, one exemplary recording medium may include a recording medium storing thereon a program that causes a test apparatus to function to test a device under test, the program causing (i) the test apparatus to function as a plurality of test modules that test the device under test; and a control section that controls the plurality of test modules; (ii) each test module to function as a test section that tests the device under test; and a self-diagnostic section that diagnoses operation of the test section based on diagnostic data supplied thereto; and (iii) the control section to supply the diagnostic data in parallel to self-diagnostic sections for which the same type of diagnostic data is set, and to supply the diagnostic data sequentially to self-diagnostic sections for which a different type diagnostic data is set.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
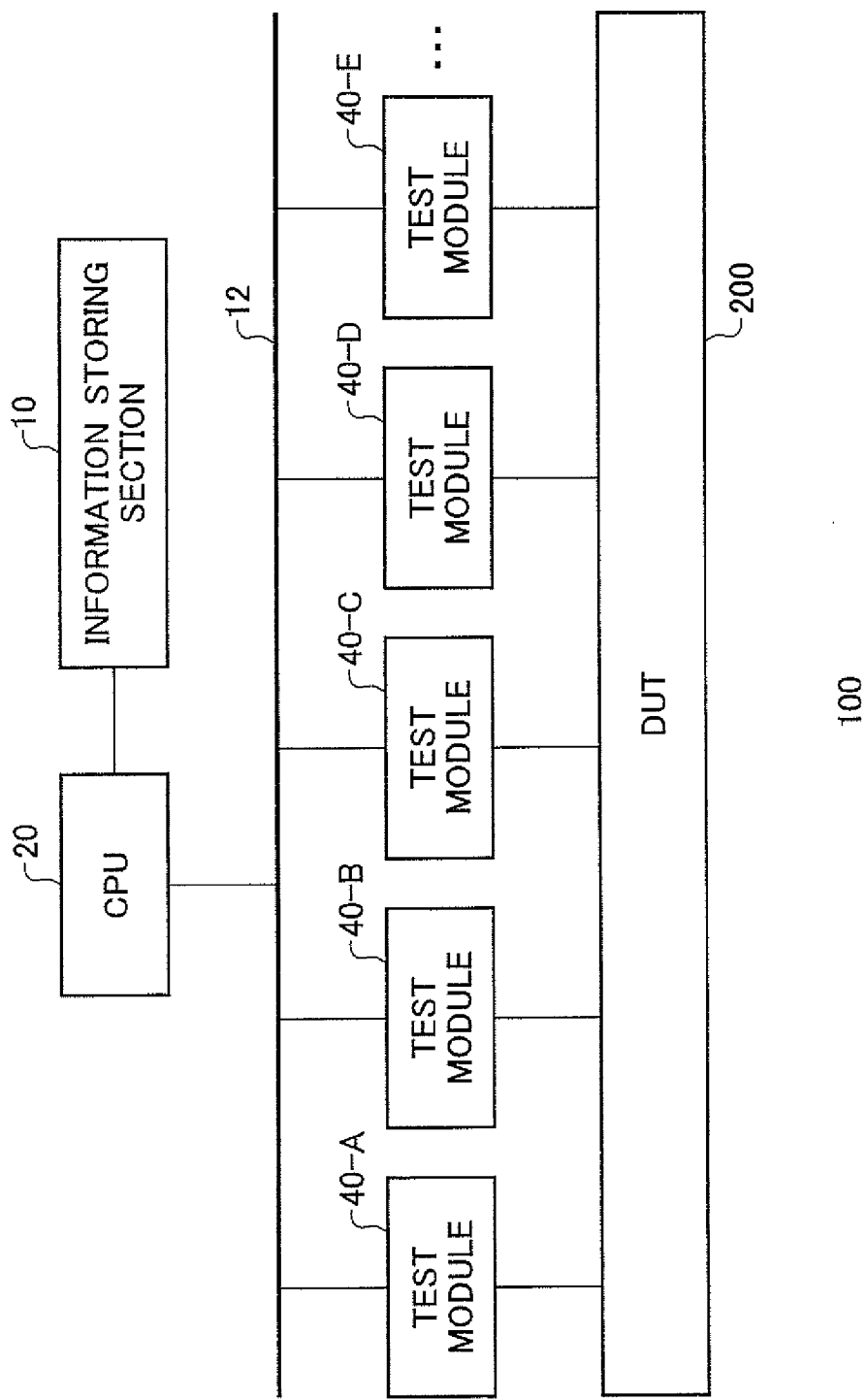
FIG. 1 shows an exemplary configuration of a test apparatus 100 according to an embodiment of the present invention.

FIG. 1 shows an exemplary configuration of a test apparatus 100 according to an embodiment of the present invention. The test apparatus 100 tests a device under test 200 such as a semiconductor circuit. The test apparatus 100 includes an information storing section 10, a bus line 12, a control section 20, and a plurality of test modules 40.

Each test module 40 is inserted into a slot in the test apparatus 100. Each test module 40 inserted into a slot tests the device under test 200 by exchanging signals with the device under test 200.

Each test module 40 may have a different function. For example, a certain test module 40 may have a function to supply a test signal having a prescribed logic pattern to the device under test 200, and another test module 40 may have a function to supply the device under test 200 with an operation clock, supply power, or the like. The test apparatus 100 tests the device under test 200 by causing the plurality of test modules 40 to operate in parallel.

The test apparatus 100 may test a single device under test 200. In this case, each test module 40 is electrically connected to a corresponding pin of the device under test 200. The test apparatus 100 may test a plurality of devices under test 200 in parallel. In this case, each test module 40 is electrically connected to a corresponding pin in a corresponding device under test 200.

The control section 20 includes a CPU and controls the test modules 40 via a bus line 12. For example, the control section 20 may control the test modules 40 according to a predetermined program.

The information storing section 10 stores module information that indicates, for each slot of the test apparatus 100, what function the test module 40 inserted into the slot has. The information storing section 10 may record identification information for the test module inserted into each slot, information indicating control data or the like to be supplied to the test module when testing the device under test 200, information indicating diagnostic data used when the test module performs a self-diagnosis, and the like.

The module information may be updated by a user every time a test module 40 is exchanged. When a test module 40 is exchanged, the test apparatus 100 may detect the identification information or the like of this test module 40, and update the module information stored in the information storing section 10.

When testing the device under test 200, the control section 20 may supply each slot with control data or the like based on the module information stored in the information storing section 10. As a result, the test apparatus 100 can test the device under test 200 using a large number of test modules 40.

The test apparatus 100 diagnoses whether each test module 40 is operating correctly. When performing a diagnosis of a test module 40, the control section 20 supplies the test module 40 in each slot with diagnostic data used in the diagnosis, based on the module information stored by the information storing section 10. As a result, the test apparatus 100 can diagnose a large number of test modules 40.

When diagnosing a test module 40, the test apparatus 100 may be provided with a diagnostic circuit in place of the device under test 200. The diagnostic circuit may input signals received from each test module 40 respectively into the test module 40 from which the signal is received, or into another test module 40.

Figure 2:
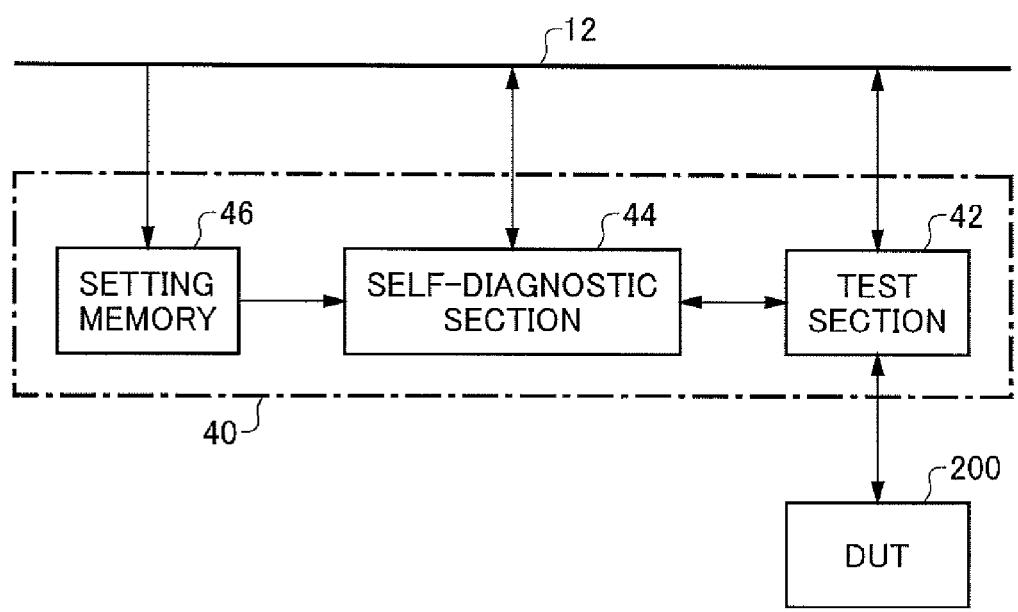
FIG. 2 shows an exemplary configuration of a test module 40.

FIG. 2 shows an exemplary configuration of a test module 40. The test module 40 includes a test section 42, a self-diagnostic section 44, and a setting memory 46. The test section 42 tests the device under test 200 by exchanging signals with a prescribed pin of the device under test 200.

For example, the test section 42 may include a circuit that generates a test signal having a prescribed logic pattern and supplies this test signal to the device under test 200, or may include a circuit that measures a response signal output by the device under test 200 to judge the acceptability of the device under test 200. The test section 42 may receive control data from the control section 20 via the bus line 12. The test section 42 may notify the control section 20 of an acceptability judgment result of the device under test 200 via the bus line 12.

The self-diagnostic section 44 diagnoses whether the test section 42 is operating correctly based on the diagnostic data applied thereto. For example, the self-diagnostic section 44 may output a prescribed diagnostic signal to the test section 42 according to the diagnostic data supplied thereto. The self-diagnostic section 44 may cause the test section 42 to measure the diagnostic signal input thereto, and may acquire the measurement result. When the measurement result matches a prescribed reference value, the control section 20 may judge that the test module 40 that output the diagnostic signal and the test module 40 that measured the diagnostic signal are operating correctly. As described above, the test module 40 that outputs the diagnostic signal may be the same test module 40 that receives the diagnostic signal.

The self-diagnostic section 44 may receive an initiation command to start diagnosis of the test section 42 from the control section 20 via the bus line 12. The self-diagnostic section 44 may notify the control section 20 of a diagnosis result of the test section 42 via the bus line 12.

The setting memory 46 receives the diagnostic data supplied from the control section 20 via the bus line 12, and stores this data. When diagnosing the test section 42, the self-diagnostic section 44 may reference the diagnostic data stored in the setting memory 46.

Figure 3:
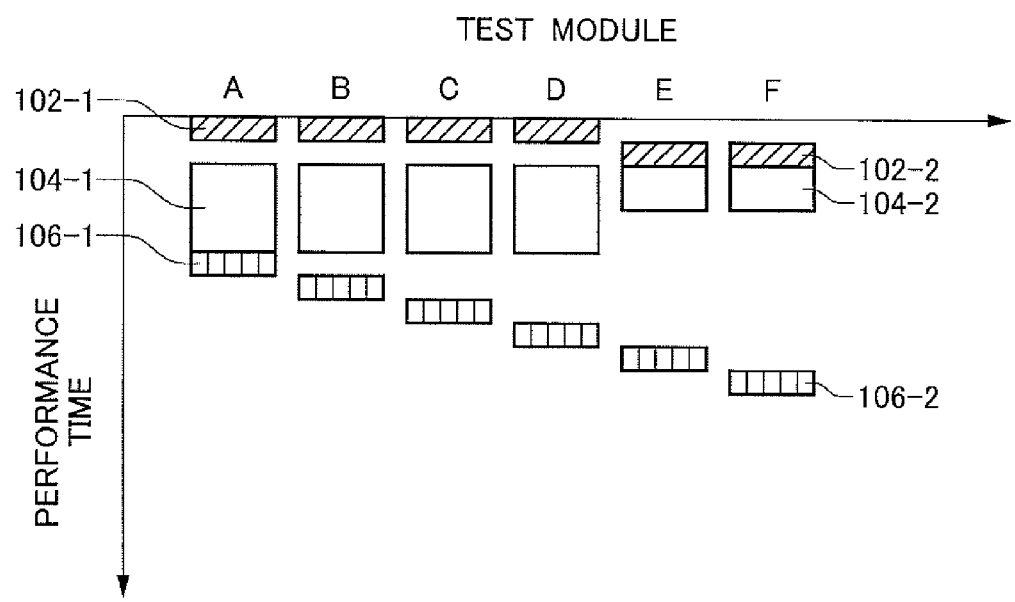
FIG. 3 shows an exemplary operation of the test apparatus 100 when diagnosing a plurality of test modules 40.

FIG. 3 shows an exemplary operation of the test apparatus 100 when diagnosing a plurality of test modules 40. FIG. 3 shows the operation of each test module 40. Test modules A through F are used as examples in FIG. 3, but the number of test modules 40 is not limited to the number shown in FIG. 3.

In this diagnosis process, the control section 20 supplies diagnostic data in parallel to the self-diagnostic sections 44 of the test modules 40 that are to use the same diagnostic data. The control section 20 supplies diagnostic data sequentially to the self-diagnostic sections 44 of the test modules 40 that are to use different diagnostic data.

For example, the self-diagnostic sections 44 in the same type of test modules 40 use the same diagnostic data to diagnose the test sections 42. By measuring the diagnostic signal output by a certain test module 40 with a different test module 40, even when diagnosing these test modules 40, the self-diagnostic sections 44 in these test modules 40 may diagnose the test sections 42 using the same diagnostic data.

The control section 20 extracts a group of test modules 40 that use the same diagnostic data, for each type of diagnostic data, based on the module information stored in the information storing section 10. In the present embodiment, the test modules 40-A and 40-B are extracted as a first group, and the test modules 40-E and 40-F are extracted as a second group.

First, the control section 20 supplies the prescribed diagnostic data in parallel to the setting memories 46 of the test modules 40 in the first group (process 102-1). After the diagnostic data is set for the setting memories 46 in the first group, the control section 20 supplies the prescribed diagnostic data in parallel to the setting memories 46 of the test modules 40 in the second group (process 102-2).

After the diagnostic data is set for the setting memories 46 of the test modules 40 in all of the groups, the control section 20 causes the self-diagnostic sections 44 in all of the test modules 40 to diagnose the corresponding test sections 42 (processes 104-1 and 104-2). For example, upon receiving notification from all of the test modules 40 that setting of the diagnostic data is finished, the control section 20 supplies all of the test modules 40 in parallel with an initiation command to begin diagnosing the test sections 42.

After all of the test modules 40 have completed the diagnoses of the test sections 42, the control section 20 analyzes the diagnosis result for each self-diagnostic section 44. The analysis of the diagnosis results uses a different expected value for each test module 40, and so the control section 20 may sequentially analyze the diagnosis results of the test modules 40.

The test apparatus 100 of the present embodiment supplies the diagnostic data in parallel to the test modules 40 that use the same diagnostic data for diagnosing the test sections 42, and can therefore decrease the total time needed to supply diagnostic data to a plurality of test modules 40. Furthermore, the test apparatus 100 of the present embodiment supplies the plurality of test modules 40 in parallel with the initiation command to begin diagnosing the test sections 42, and can therefore perform the diagnosis processes in parallel to decrease the total time needed to diagnose a plurality of test sections 42.

Figure 4:
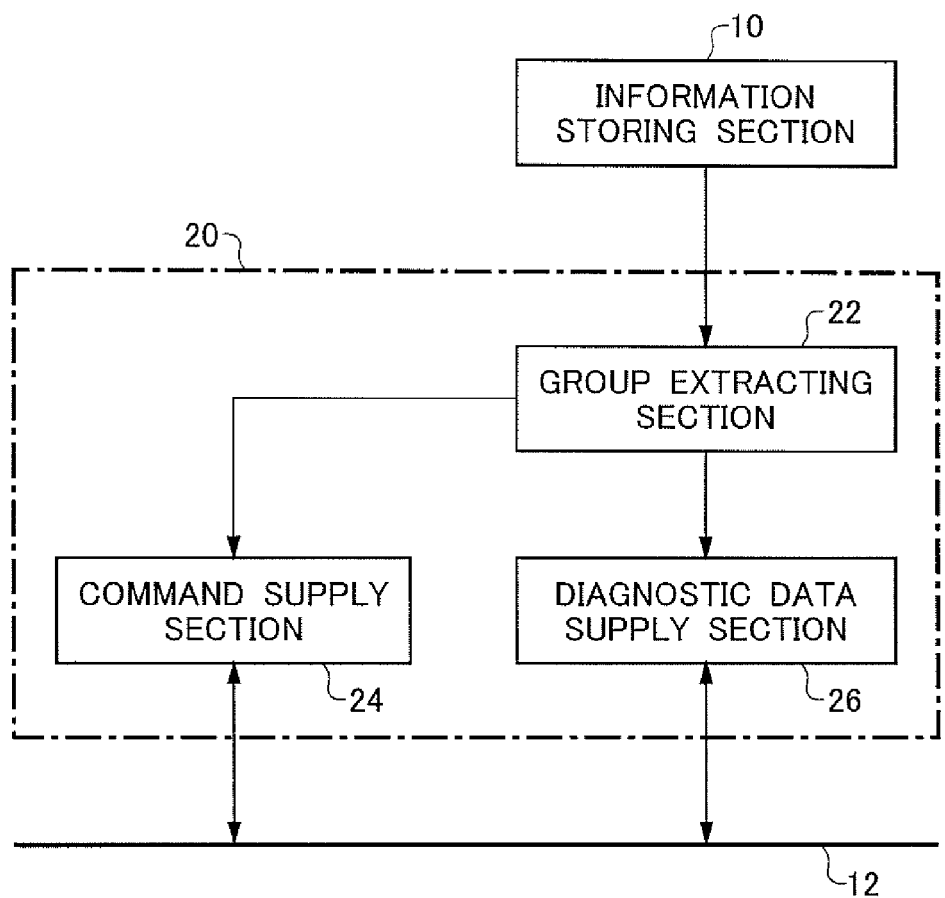
FIG. 4 shows an exemplary functional configuration of the control section 20.

FIG. 4 shows an exemplary functional configuration of the control section 20. The control section 20 includes a group extracting section 22, a command supply section 24, and a diagnostic data supply section 26. The group extracting section 22 extracts a group of self-diagnostic sections 44 for which the same diagnostic data is to be set, for each type of diagnostic data, based on the module information stored by the information storing section 10. For example, the group extracting section 22 may extract these groups based on the identification information stored by the information storing section 10 indicating the type of each test module 40 or information stored by the information storing section 10 indicating the function of each test module 40. The group extracting section 22 may extract these groups based on information stored by the information storing section 10 indicating diagnostic data to be set for each test module 40.

The diagnostic data supply section 26 supplies the diagnostic data sequentially to the groups extracted by the group extracting section 22. The diagnostic data supply section 26 may supply the diagnostic data via the bus line 12. As described above, the diagnostic data supply section 26 supplies the same diagnostic data in parallel to the test modules 40 in the same group.

When the diagnostic data supply section 26 has set diagnostic data fort all of the groups, the command supply section 24 causes the self-diagnostic section 44 of each test module 40 to test the corresponding test section 42 in parallel. Upon receiving notification from all of the test modules 40 that the diagnostic data has been set, the command supply section 24 may supply the initiation command to begin the diagnosis to the self-diagnostic sections 44 of all the test modules 40. With this configuration, the test apparatus 100 can cause the test modules 40 to perform efficient self diagnosis.

The command supply section 24 may be connected to each test module 40 via the bus line 12. The command supply section 24 may determine which test modules 40 are to be supplied with the initiation command based on the module information stored by the information storing section 10. The command supply section 24 may supply the initiation command to the test modules 40 indicated by the group extracting section 22.

Figure 5:
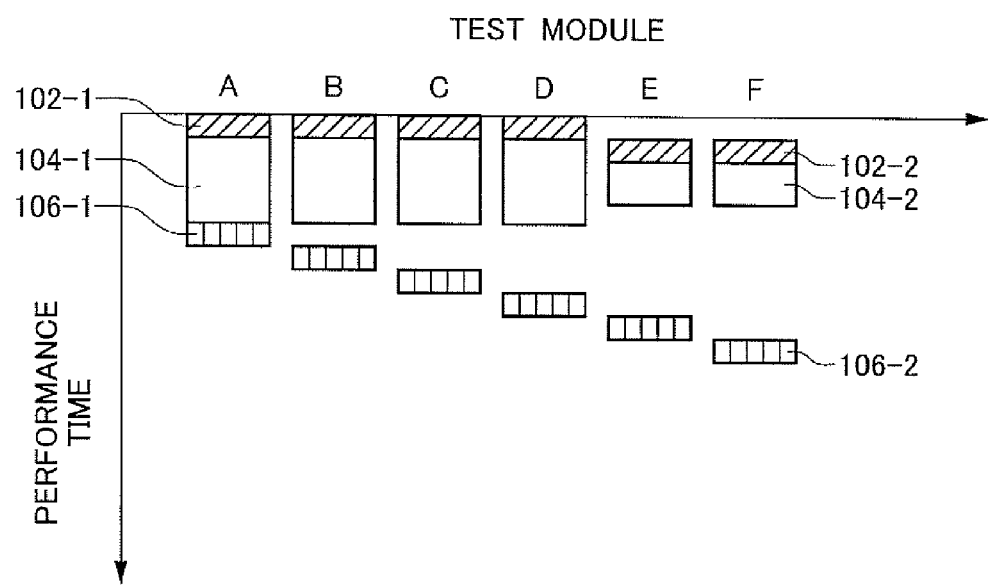
FIG. 5 shows another exemplary operation of the test apparatus 100 when diagnosing a plurality of test modules 40.

FIG. 5 shows another exemplary operation of the test apparatus 100 when diagnosing a plurality of test modules 40. The diagnostic data supply section 26 of the present embodiment supplies the diagnostic data to at least one group while the self-diagnostic sections 44 of another group are diagnosing the test sections 42. For example, while the self-diagnostic sections 44 in the first group are diagnosing the test sections 42 (process 104-1), the diagnostic data supply section 26 may supply the diagnostic data to the setting memories 46 in the second group (process 102-2).

In this case, when the setting of diagnostic data for the first group is completed, the command supply section 24 supplies the first group with the initiation command to begin diagnosing the test sections 42 (process 104-1). After the command supply section 24 has supplied the initiation command to the first group, the diagnostic data supply section 26 may set the diagnostic data for the second group (process 104-2). In this way, the waiting time between process 102-1 and process 104-1 can be shortened.

The diagnostic data supply section 26 may supply the diagnostic data to the groups extracted by the group extracting section 22 sequentially in an order beginning with the group needing the longest time to diagnose the test sections 42, i.e. the group whose process 104 takes the longest time. In this way, the time needed to diagnose all of the test sections 42 is shortened.

Figure 6:
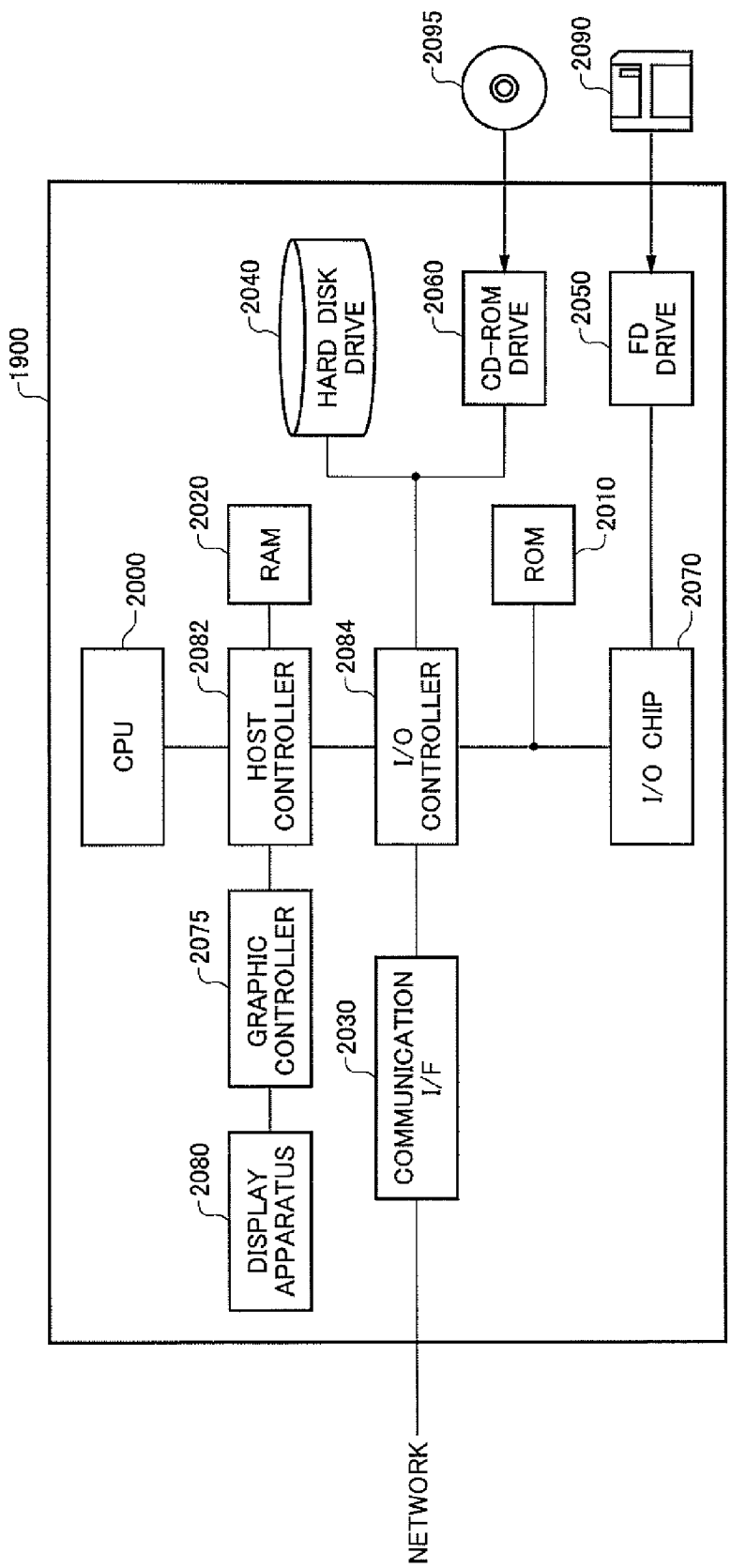
FIG. 6 shows an example of a hardware configuration of a computer 1900 according to the present embodiment.
Figure 7:
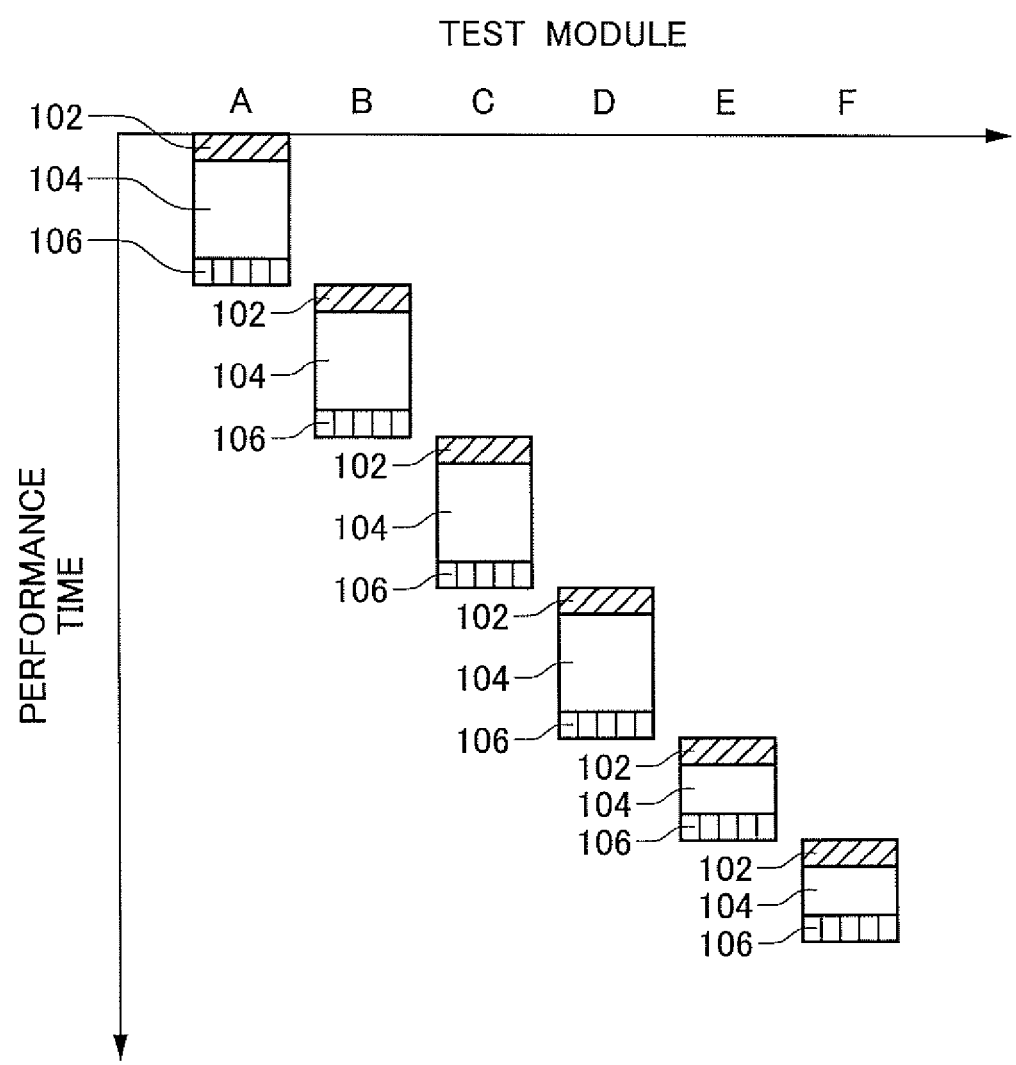
FIG. 7 shows an exemplary diagnostic operation performed by a plurality of test modules.

FIG. 6 shows an example of a hardware configuration of a computer 1900 according to the present embodiment. The computer 1900 may function as at least a portion of the test apparatus 100 described in relation to FIGS. 1 to 5. For example, the computer 1900 may function as the control section 20 and the information storing section 10 of the test apparatus 100.

The computer 1900 according to the present embodiment is provided with a CPU peripheral, an input/output section, and a legacy input/output section. The CPU peripheral includes a CPU 2000, a RAM 2020, a graphic controller 2075, and a displaying apparatus 2080, all of which are connected to each other by a host controller 2082. The CPU 2000 may function as the control section 20. The RAM 2020 may function as the information storing section 10.

The input/output section includes a communication interface 2030, a hard disk drive 2040, and a CD-ROM drive 2060, all of which are connected to the host controller 2082 by an input/output controller 2084. The legacy input/output section includes a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the displaying apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

The programs are installed in the computer 1900. These programs cause the computer 1900 to function as a portion of the test apparatus 100.

The programs shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
    a plurality of test modules that test the device under test, each test module including a test section that tests the device under test and a self-diagnostic section that diagnoses operation of the test section based on diagnostic data supplied thereto; and
    a control section that supplies the diagnostic data in parallel to self-diagnostic sections for which the same type of diagnostic data is set, and supplies the diagnostic data sequentially to self-diagnostic sections for which a different type of diagnostic data is set, from among the self-diagnostic sections of the plurality of test modules.

2. The test apparatus according to claim 1, further comprising an information storing section that stores module information relating to a function of each test module, wherein
    the control section supplies the diagnostic data to each self-diagnostic section based on the module information.

3. The test apparatus according to claim 2, wherein the control section includes:
    a group extracting section that extracts a group of self-diagnostic sections for which the same type of diagnostic data is to be set, for each type of diagnostic data, based on the module information stored in the information storing section; and
    a diagnostic data supply section that supplies a corresponding type of diagnostic data in parallel to each group of self-diagnostic sections.

4. The test apparatus according to claim 3, wherein the control section causes each self-diagnostic section to diagnose the corresponding test section in parallel.

5. The test apparatus according to claim 4, wherein the control section further includes a command supply section that supplies an initiation command for diagnosing the test sections in parallel to a plurality of the self-diagnostic sections.

6. The test apparatus according to claim 5, wherein when the diagnostic data supply section has set the diagnostic data for all of the groups, the command supply section supplies the self-diagnostic sections with the initiation command in parallel.

7. The test apparatus according to claim 5, wherein the command supply section supplies the initiation command in sequence beginning with a group that first finishes setting the diagnostic data from the diagnostic data supply section.

8. The test apparatus according to claim 7, wherein the diagnostic data supply section sets the diagnostic data for at least one group while the self-diagnostic sections in another group are diagnosing the corresponding test sections.

9. The test apparatus according to claim 8, wherein the diagnostic data supply section supplies the diagnostic data in sequence beginning with a group that requires the longest time to diagnose the corresponding test sections.

10. A non-transitory recording medium storing thereon a program that causes a test apparatus to function to test a device under test, the program causing the test apparatus to function as:
    a plurality of test modules that test the device under test, each test module functioning as a test section that tests the device under test and a self-diagnostic section that diagnoses operation of the test section based on diagnostic data supplied thereto; and
    a control section that supplies the diagnostic data in parallel to self-diagnostic sections for which the same type of diagnostic data is set, and supplies the diagnostic data sequentially to self-diagnostic sections for which a different type diagnostic data is set, from among the self-diagnostic sections of the plurality of test modules.

11. A method of testing a device under test using test apparatus including a plurality of test modules, each test module including a test section that tests the device under test and a self-diagnostic section that diagnoses operation of the test section based on diagnostic data supplied thereto, the method comprising:
    supplying the diagnostic data in parallel to self-diagnostic sections for which the same type of diagnostic data is set, from among the self-diagnostic sections of the plurality of test modules; and
    supplying the diagnostic data sequentially to self-diagnostic sections for which a different type of diagnostic data is set, from among the self-diagnostic sections of the plurality of test modules.

12. The method according to claim 11, wherein
the test apparatus further includes an information storing section that stores module information relating to a function of each test module, and
the diagnostic data is supplied to each self-diagnostic section based on the module information.

13. The method according to claim 12, further comprising:
extracting a group of self-diagnostic sections for which the same type of diagnostic data is to be set, for each type of diagnostic data, based on the module information stored in the information storing section; and
supplying a corresponding type of diagnostic data in parallel to each group of self-diagnostic sections.

14. The method according to claim 13, further comprising causing each self-diagnostic section to diagnose the corresponding test section in parallel.

15. The method according to claim 14, further comprising supplying an initiation command for diagnosing the test sections in parallel to a plurality of the self-diagnostic sections.

16. The method according to claim 15, wherein
said supplying the initiation command comprises supplying the self-diagnostic sections with the initiation command in parallel when the diagnostic data has been set for all of the groups.

17. The method according to claim 15, wherein
said supplying the initiation command comprises supplying the initiation command in sequence beginning with a group that first finishes setting the diagnostic data.

18. The method according to claim 17, wherein
the diagnostic data for at least one group is set while the self-diagnostic sections in another group are diagnosing the corresponding test sections.

19. The method according to claim 18, wherein
the diagnostic data is supplied in sequence beginning with a group that requires the longest time to diagnose the corresponding test sections.

* * * * *